(12) United States Patent
Shin et al.

(10) Patent No.: US 9,164,139 B2
(45) Date of Patent: Oct. 20, 2015

(54) MEMORY DEVICE AND MEMORY SYSTEM INCLUDING THE SAME

(71) Applicant: Samsung Electronics Co., Ltd., Suwon-si (KR)

(72) Inventors: Jun Hee Shin, Seongnam-si (KR); Young Man Ahn, Hwaseong-si (KR); Seung Mo Jung, Suwon-si (KR); You Keun Han, Johns creek, GA (US); Sang Jhun Hwang, Pyeongtaek-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 133 days.

(21) Appl. No.: 13/962,233

(22) Filed: Aug. 8, 2013

(65) Prior Publication Data
US 2014/0043920 A1 Feb. 13, 2014

(30) Foreign Application Priority Data

Aug. 10, 2012 (KR) .................. 10-2012-0087948

(51) Int. Cl.
*G01R 31/02* (2006.01)
*G01R 31/01* (2006.01)
(Continued)

(52) U.S. Cl.
CPC ............... *G01R 31/02* (2013.01); *G01R 31/01* (2013.01); *G01R 31/26* (2013.01); *G11C 5/04* (2013.01); *G11C 7/1012* (2013.01); *G11C 7/1021* (2013.01); *G11C 7/1069* (2013.01); *G11C 7/1096* (2013.01); *G11C 11/4096* (2013.01); *G11C 29/1201* (2013.01); *G01R 31/27* (2013.01); *G06F 13/28* (2013.01); *G06F 17/5054* (2013.01); *G11C 7/1036* (2013.01); *G11C 7/1078* (2013.01);
(Continued)

(58) Field of Classification Search
CPC ........ G01R 31/02; G01R 31/26; G01R 31/27; G01R 31/01; G11C 2029/4002; G11C 2029/0401; G11C 29/02; G11C 29/14; G11C 7/1078; G11C 7/1036; G11C 11/4096; G11C 7/1021; G11C 7/1096; G11C 7/1069; G11C 7/1012; G06F 13/28
See application file for complete search history.

(56) References Cited

U.S. PATENT DOCUMENTS 6,175,941 B1 * 1/2001 Poeppelman et al. ........ 714/757
6,476,634 B1 * 11/2002 Bilski ............................ 326/40
(Continued)

FOREIGN PATENT DOCUMENTS

KR  10-2005-0011318    1/2005
KR  10-0907927         12/2008

*Primary Examiner* — Richard Elms
*Assistant Examiner* — Ajay Ojha
(74) *Attorney, Agent, or Firm* — Muir Patent Law, PLLC

(57) ABSTRACT

A memory device includes a memory cell array and a data input/output circuit. The memory cell array includes a plurality of memory cells connected to a plurality of bit lines and a plurality of word lines. The data input/output circuit is configured to receive data from external data pins of the memory device, output the received data to the memory cell array through a plurality of input/output lines electrically coupled to the plurality of bit lines, receive data read from the memory cell array through the plurality of input/output lines, and output the read data through the external data pins. For each external data pin, the data input/output circuit is configured to output data received at the external data pin to a corresponding input/output line. The corresponding input/output line is selected in response to bit values of a set of bits included in the received data.

14 Claims, 12 Drawing Sheets

(51) Int. Cl.
*G01R 31/26* (2014.01)
*G11C 11/4096* (2006.01)
*G11C 5/04* (2006.01)
*G11C 29/12* (2006.01)
*G01R 31/27* (2006.01)
*G11C 7/10* (2006.01)
*G11C 29/02* (2006.01)
*G11C 29/14* (2006.01)
*G11C 29/04* (2006.01)
*G11C 29/40* (2006.01)
*G06F 13/28* (2006.01)
*G11C 11/406* (2006.01)
*H03M 13/00* (2006.01)
*H03M 7/40* (2006.01)
*G06F 17/50* (2006.01)

(52) U.S. Cl.
CPC ............ *G11C 11/406* (2013.01); *G11C 29/02* (2013.01); *G11C 29/14* (2013.10); *G11C 2029/0401* (2013.01); *G11C 2029/4002* (2013.01); *H03M 7/40* (2013.01); *H03M 13/00* (2013.01)

(56) References Cited

U.S. PATENT DOCUMENTS

| | | | |
|---|---|---|---|
| 2005/0276141 A1* | 12/2005 | Pelley et al. | 365/221 |
| 2006/0071829 A1* | 4/2006 | Pearlstein et al. | 341/67 |
| 2006/0126408 A1* | 6/2006 | Bucksch | 365/200 |
| 2006/0171234 A1 | 8/2006 | Liu et al. | |
| 2007/0101225 A1 | 5/2007 | Moon et al. | |
| 2009/0063731 A1* | 3/2009 | Gower et al. | 710/35 |
| 2009/0103376 A1* | 4/2009 | Kanda | 365/189.05 |
| 2009/0172480 A1 | 7/2009 | Jeddeloh | |

* cited by examiner

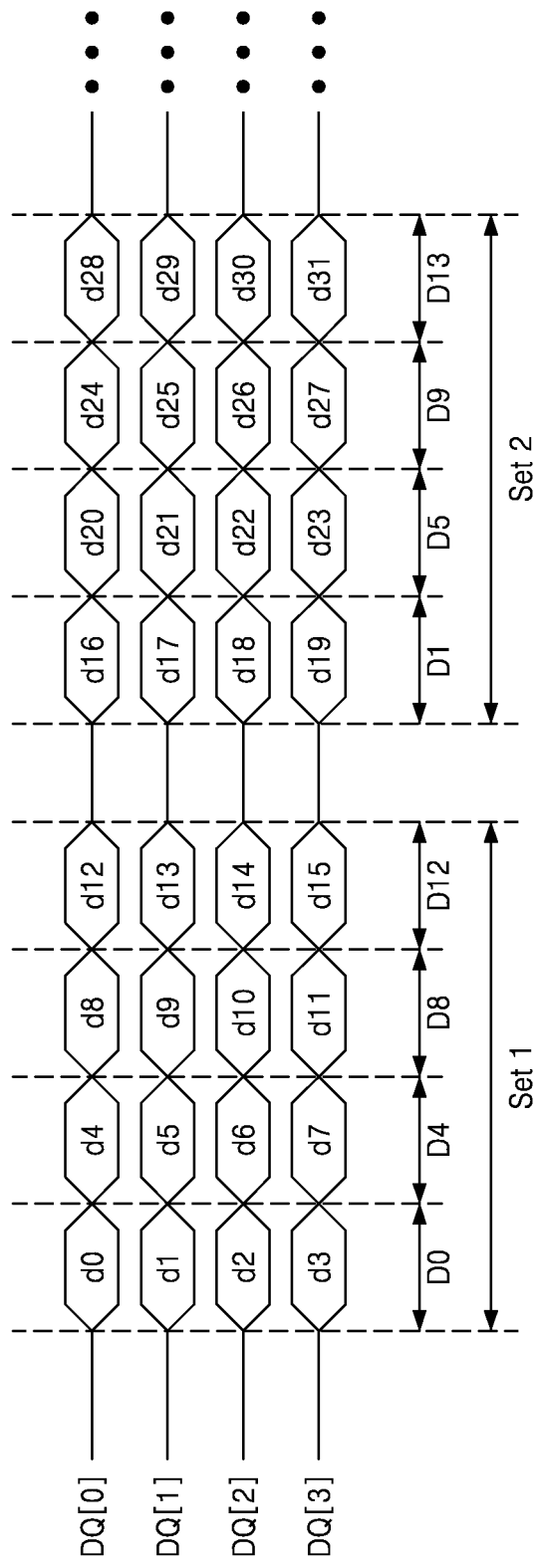

MEMORY DEVICE AND MEMORY SYSTEM INCLUDING THE SAME

CROSS-REFERENCE TO RELATED APPLICATIONS

This application claims priority under 35 U.S.C. §119(a) to Korean Patent Application No. 10-2012-0087948 filed on Aug. 10, 2012, the disclosure of which is hereby incorporated by reference in its entirety.

BACKGROUND

With the development of memory systems including a memory device, the number of memory devices included in a single memory module or system has increased. Accordingly, the possibility of defects occurring in memory devices has also increased. Therefore, a test procedure for searching out and detecting defects has become important.

In general, in testing a memory device, data is written to memory cells in the memory device using an external test device, the data is read from the memory cells, and then the data that has been read is compared with the data that has been written to determine whether the memory device is good or bad. When the test device tests a plurality of memory devices included in a single memory module or a single memory system using particular data, the test device often needs to repeatedly perform a test on each of the memory devices since data lines connected between the test device and the memory devices are different. Therefore, a long test time is typically required.

Furthermore, when a memory module includes a plurality of memory devices and a memory controller controlling the memory devices, it is difficult for the memory controller to input predetermined data to a particular data line of a memory device.

SUMMARY

According to some embodiments, a memory device includes a memory cell array and a data input/output circuit. The memory cell array includes a plurality of memory cells connected to a plurality of bit lines and a plurality of word lines. The data input/output circuit is configured to receive data from external data pins of the memory device, output the received data to the memory cell array through a plurality of input/output lines electrically coupled to the plurality of bit lines, receive data read from the memory cell array through the plurality of input/output lines, and output the read data through the external data pins. For each external data pin, the data input/output circuit is configured to output data received at the external data pin to a corresponding input/output line, wherein the corresponding input/output line is selected in response to bit values of a set of bits included in the received data.

According to some embodiments, a memory device includes a memory cell array and a data input/output circuit. The memory cell array includes a plurality of memory cells connected to a plurality of bit lines and a plurality of word lines. The data input/output circuit is configured to receive at least a first set of data from a first external data pin of a plurality of external data pins of the memory device, the first set of data including first through nth subsets of data, and receive at least a second set of data from a second external data pin of the plurality of external data pins of the memory device, the second set of data including first through nth subsets of data corresponding to the first through nth subsets of data of the first set of data. The data input/output circuit is further configured to, each corresponding subset of data in the first set of data and the second set of data, perform a logic operation on the corresponding subset of data; for each logic operation performed on a corresponding subset of data, output the results of the logic operation to the memory cell array through corresponding input/output lines, the input/output lines including first through nth input/output lines; receive data read from the memory cell array through the first through nth input/output lines; and output the read data through the plurality of external data pins. The n is a natural number greater than 1.

According to some embodiments, a memory device includes a memory cell array and a data input/output circuit. The memory cell array includes a plurality of memory cells connected to a plurality of bit lines and a plurality of word lines. The data input/output circuit is configured to receive data from external data pins of the memory device, output the received data to the memory cell array through a plurality of input/output lines electrically coupled to the plurality of bit lines, receive data read from the memory cell array through the plurality of input/output lines, and output the read data through the external data pins. For a first external data pin, the data input/output circuit is configured to output data received at the first external data pin to a selected input/output line. The input/output line is selected based on a first input/output line code included in the data received from the first external data pin.

BRIEF DESCRIPTION OF THE DRAWINGS

Exemplary embodiments will be more clearly understood from the following detailed description taken in conjunction with the attached drawings in which:

FIGS. 11A and 11B are diagrams of an example of setting an input/output line using the data input/output circuit illustrated in FIG. 10 according to some embodiments.

DETAILED DESCRIPTION OF THE EMBODIMENTS

Figure 1:
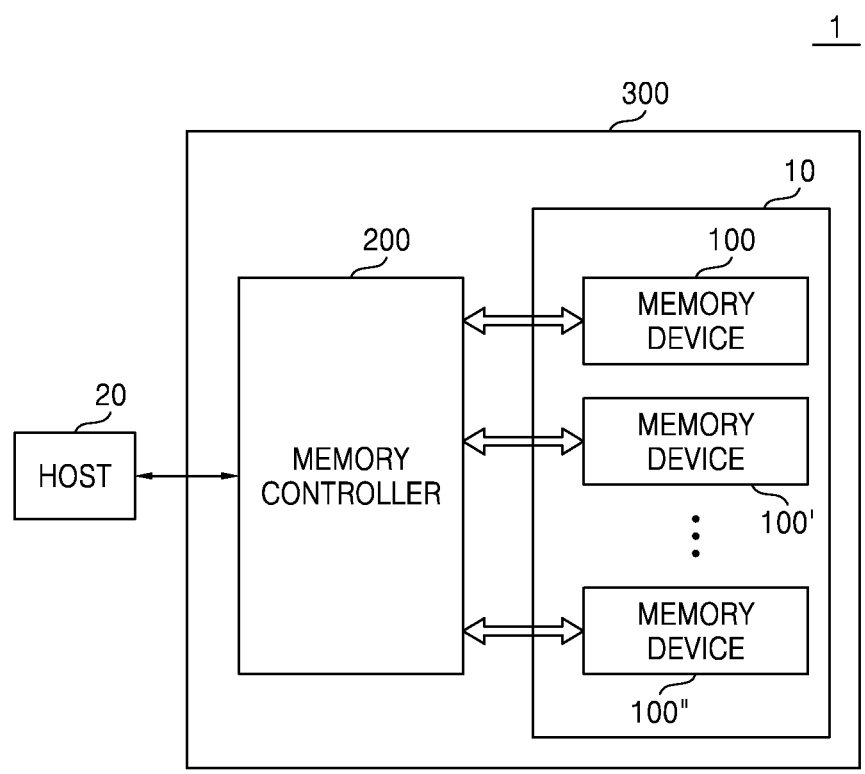
FIG. 1 is a schematic block diagram of an electronic system according to some embodiments.

Example embodiments now will be described more fully hereinafter with reference to the accompanying drawings, in which embodiments of the disclosure are shown. This disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

The disclosed example embodiments relate to a memory device and a memory module, and more particularly, to a memory module for allowing data the same as particular data input by a test device to be input to each of a plurality of memory devices in the memory module having different forms of data lines. A memory system including the memory device is also disclosed.

FIG. 1 is a schematic block diagram of an electronic system 1 according to some embodiments. The electronic system 1 includes a host 20 and a memory system 300. The memory system 300 may include a memory controller 200 and a memory module 10.

The host 20 may communicate with the memory system 300 using an interface protocol such as a peripheral component interconnect express (PCI-E) protocol, an advanced technology attachment (ATA) protocol, a serial ATA (SATA) protocol, a parallel ATA (PATA) protocol, or a serial attached SCSI (SAS) protocol. However, the interface protocol between the host 20 and the memory system 300 is not restricted to those examples. The interface protocol may be a universal serial bus (USB) protocol, a multimedia card (MMC) protocol, an enhanced small disk interface (ESDI) protocol, or an integrated drive electronics (IDE) protocol.

In one embodiment, the memory controller 200 controls the overall operation of the memory system 300 and also controls all data exchanges between the host 20 and the memory module 10.

The memory module 10 may include memory devices 100, 100', and 100". In the embodiments described below, each of the memory devices 100, 100', and 100" can be a dynamic random access memory (DRAM) that includes a memory cell array (not shown) in which a plurality of memory cells are arranged in a row direction and a column direction. However, the disclosure is not restricted to these embodiments. For example, each of the memory devices 100, 100', and 100" may be implemented as a static RAM (SRAM), a thyrister RAM (T-RAM), a zero capacitor RAM (Z-RAM), or a twin transistor RAM (TTRAM).

When the memory devices 100, 100', and 100" are implemented using DRAM, the memory module 10 may be implemented by an unbuffered dual inline memory module (UDIMM), a registered DIMM (RDIMM), or a load reduced DIMM (LR-DIMM). The memory module 10 may also include a buffer (not shown) or a register (not shown).

The memory system 300 may be installed in a system such as mobile equipment, a notebook computer, or a desktop computer, but the disclosure is not restricted thereto.

Figure 2:
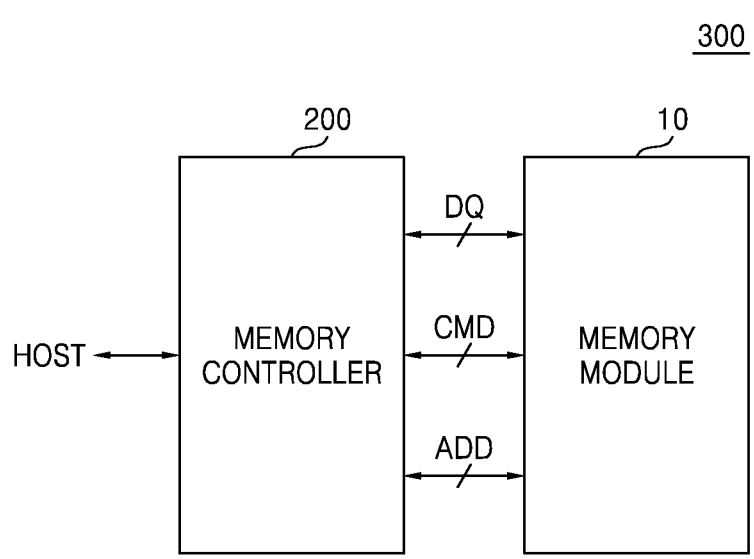
FIG. 2 is a schematic block diagram of a memory system according to some embodiments.

FIG. 2 is a schematic block diagram of the memory system 300 according to some embodiments. Referring to FIG. 2, the memory controller 200 inputs data to the memory devices 100, 100', and 100" included in the memory module 10 and outputs data from the memory devices 100, 100', and 100" through a data pin DQ in response to a request of the host 20. The memory controller 200 may continuously perform an operation of applying an address signal ADD together with a command CMD for an active operation of the memory devices 100, 100', and 100"; an operation of applying the address signal ADD together with a command CMD for a write operation or a read operation; and an operation of applying the address signal ADD together with a command CMD for a refresh operation. The memory controller 200 may also output data and data information corresponding to the data to one of the memory devices 100, 100', and 100" in order to input the data through a particular data pin DQ of the memory device 100, 100', or 100".

Figure 3:
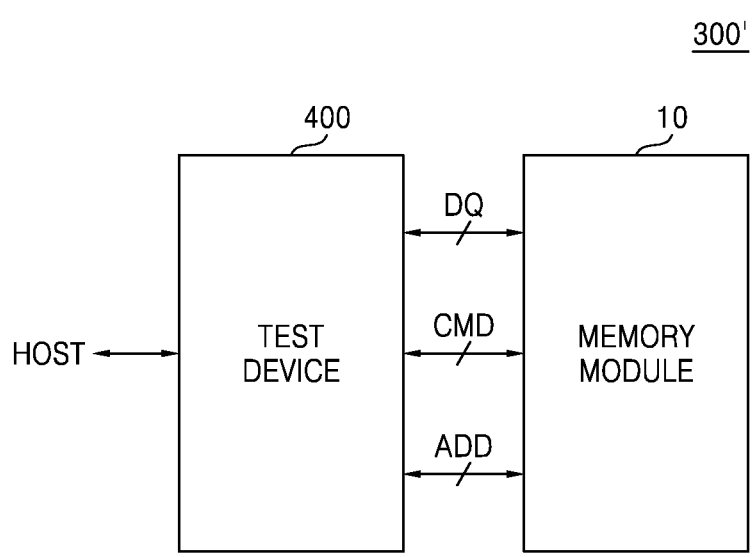
FIG. 3 is a schematic block diagram of a memory system according to other embodiments.

FIG. 3 is a schematic block diagram of a memory system 300' according to other embodiments. Referring to FIG. 3, the memory system 300' may include the memory module 10 illustrated in FIGS. 1 and 2 and a test device 400 that performs a test operation on the memory devices 100, 100', and 100" included in the memory module 10.

The test device 400 may control the test operation on the memory devices 100, 100', and 100" based on a form of a data line connected to each of the memory devices 100, 100', and 100". To control the test operation, the test device 400 may input data and data information corresponding to the data as well to the memory device 100, 100', or 100" to be tested.

In one embodiment, the memory controller 200 illustrated in FIG. 2 may be implemented to perform the function of the test device 400 as well as the function of a memory controller.

Figure 4:
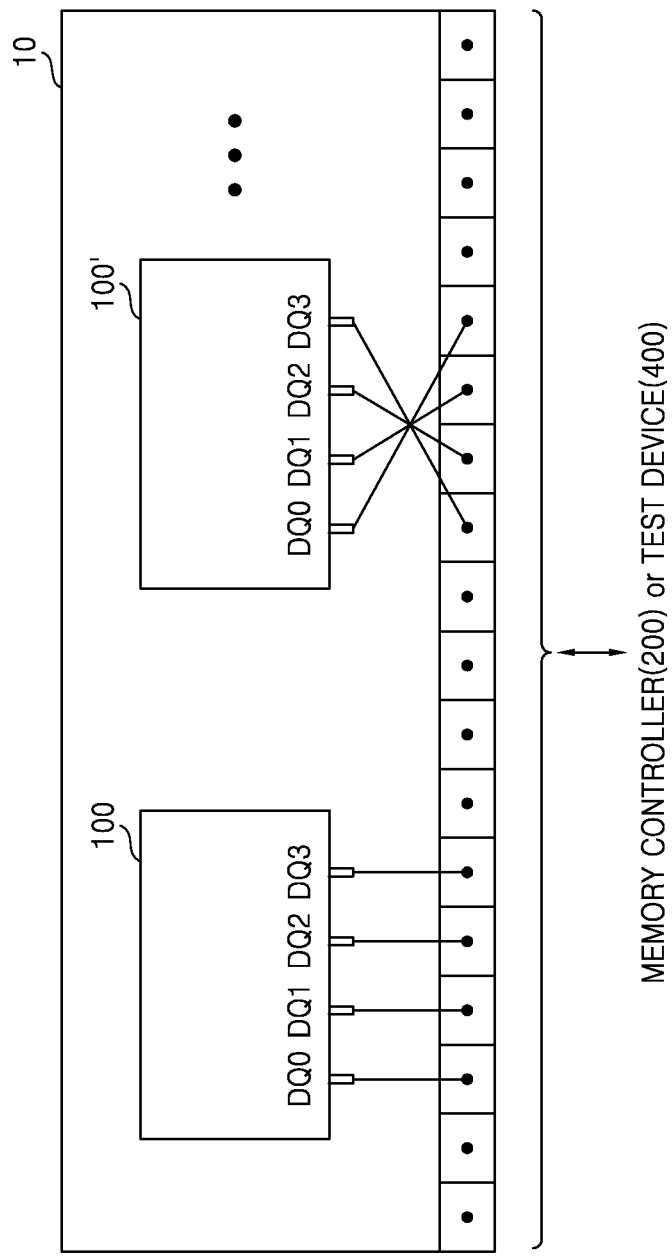
FIG. 4 is a schematic block diagram of a memory module according to some embodiments.

FIG. 4 is a schematic block diagram of the memory module 10 according to some embodiments. Referring to FIG. 4, when the memory devices 100, 100', and 100" are mounted on a substrate (e.g., a printed circuit board (PCB)), forming the single memory module 10, they may receive data through data lines from the external memory controller 200 or test device 400.

At this time, some of the memory devices 100, 100', and 100" may receive the data as it is from the memory controller 200 or the test device 400 through data lines. However, the order of data lines for others of the memory devices 100, 100', and 100" may be changed due to constraints on the layout of the memory devices 100, 100', and 100" mounted on the memory module 10, and therefore, the others of the memory devices 100, 100', and 100" may not receive data the same as that input by the memory controller 200 or the test device 400.

In one embodiment, as shown in FIG. 4, while the first memory device 100 receives data the same way as particular data input by the memory controller 200 or the test device 400, the second memory device 100' does not receive data the same way as the particular data. However, according to some embodiments, even though the memory devices 100, 100', and 100" are connected with the memory controller 200 or the test device 400 through data lines in different forms, the memory devices 100, 100', and 100" can receive data the same way as data that is externally input. Such memory device is illustrated in FIG. 5.

Figure 5:
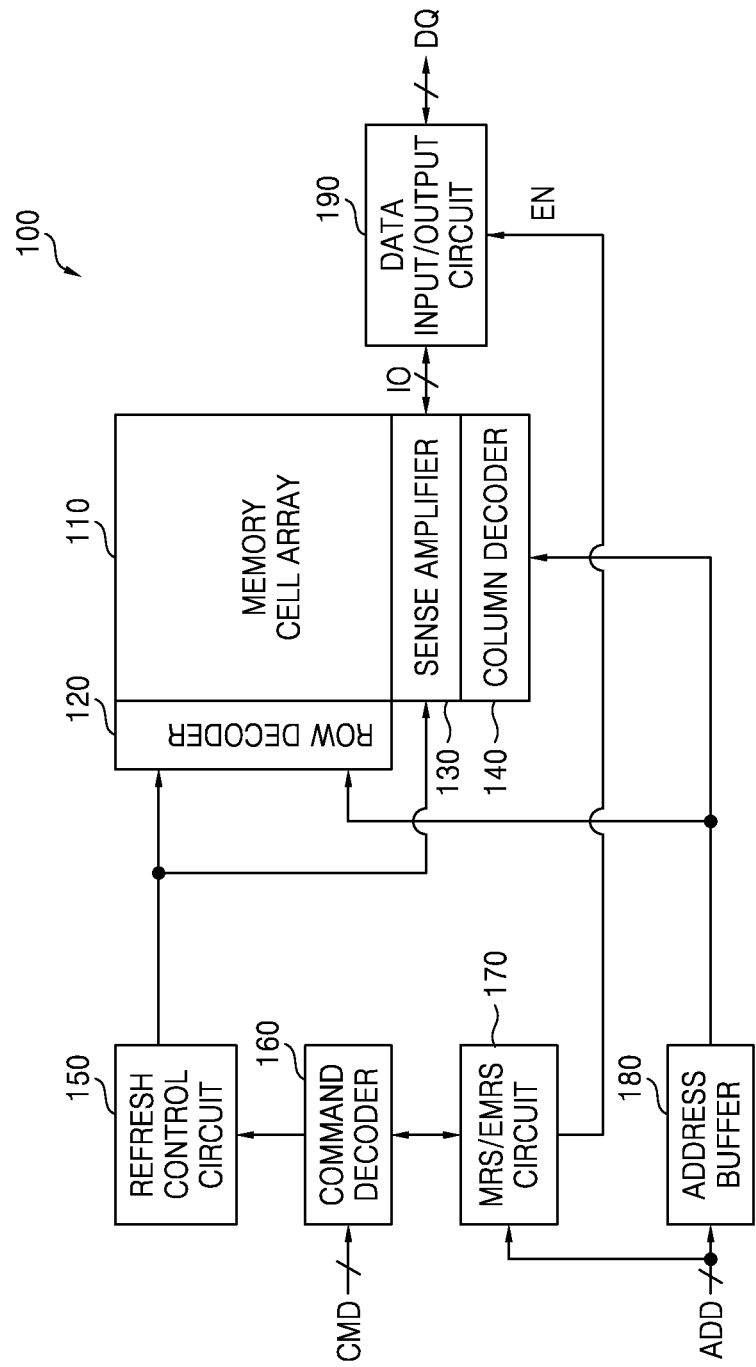
FIG. 5 is a schematic block diagram of a memory device illustrated in FIG. 4 according to some embodiments.

FIG. 5 is a schematic block diagram of the memory device 100 illustrated in FIG. 4 according to some embodiments. The memory device 100 illustrated in FIG. 5 is an example of one of the memory devices 100, 100', and 100" illustrated in FIG. 4.

The operation of the memory device 100 is controlled by the memory controller 200 in the current embodiments, but the disclosure is not restricted to the current embodiments. The memory device 100 may also be used when a test operation is performed by the test device 400.

Referring to FIG. 5, the memory device 100 includes a memory cell array 110, a row decoder 120, a sense amplifier 130, a column decoder 140, a refresh control circuit 150, a command decoder 160, a mode register set/extended mode register set (MRS/EMRS) circuit 170, an address buffer 180, and a data input/output circuit 190.

In one embodiment, the memory cell array 110 is a data storage in which a plurality of memory cells are arranged in a row direction and a column direction. The sense amplifier 130 senses and amplifies data from a memory cell and also stores data in the memory cells. The memory cell array 110 illustrated in FIG. 5 may include four memory banks (e.g., first through fourth memory banks), but the disclosure is not restricted thereto.

Data input through the data input/output circuit 190 is written to the memory cell array 110 based on an address signal ADD, and data read from the memory cell array 110 based on the address signal ADD is output to the memory controller 200 through the data input/output circuit 190.

The data input/output circuit 190 may receive data and data information included in the received data from the memory controller 200 and output the received data corresponding to the data information to the sense amplifier 130 according to the order of data pins DQ based on the data information. For example, the data input/output circuit 190 may output the received data to the sense amplifier 130 through corresponding input/output lines IO.

Alternatively, the data input/output circuit 190 may perform a logic operation on first data received from the memory controller 200 and output second data computed based on a result of performing the logic operation to the sense amplifier 130 according to the order of data pins DQ. The detailed structure of such data input/output circuit 190 will be described with reference to FIGS. 6 through 11B later.

To designate a memory cell to or from which data will be written or read, the address signal ADD is input to the address buffer 180. The address buffer 180 temporarily stores the address signal ADD input by the memory controller 200.

The row decoder 120 decodes a row address in the address signal ADD output from the address buffer 180 in order to designate a word line connected with a memory cell to or from which the data will be written or read.

In one embodiment, the row decoder 120 decodes a row address output from the address buffer 180 and enables a corresponding word line in a data write or read mode. In addition, the row decoder 120 enables a word line based on a row address generated by the refresh control circuit 150.

The column decoder 140 decodes a column address in the address signal ADD output from the address buffer 180 in order to designate a bit line connected with the memory cell to or from which the data will be written or read.

The memory cell array 110 writes the data to or reads the data from the memory cell designated by the row address and the column address.

The command decoder 160 receives commands CMD from the memory controller 200 and decodes the commands CMD so as to internally generate decoded command signals (e.g., an active signal, a read signal, a write signal, and a refresh signal).

The refresh control circuit 150 receives a refresh signal decoded by the command decoder 160 and outputs an internal row address to the row decoder 120 to enable a word line in the memory cell array 110.

The MRS/EMRS circuit 170 sets an internal mode register in response to an MRS/EMRS command for setting an operation mode of the memory device 100 and the address signal ADD. In addition, the MRS/EMRS circuit 170 may output an enable signal EN to the data input/output circuit 190 to control the operation of the data input/output circuit 190 according to the write operation or the read operation of the memory device 100.

Although not shown in FIG. 5, the memory device 100 may also include a clock circuit (not shown) that generates a clock signal and a power supply circuit (not shown) that receives an external power supply voltage and generates or distributes an internal voltage.

Figure 6:
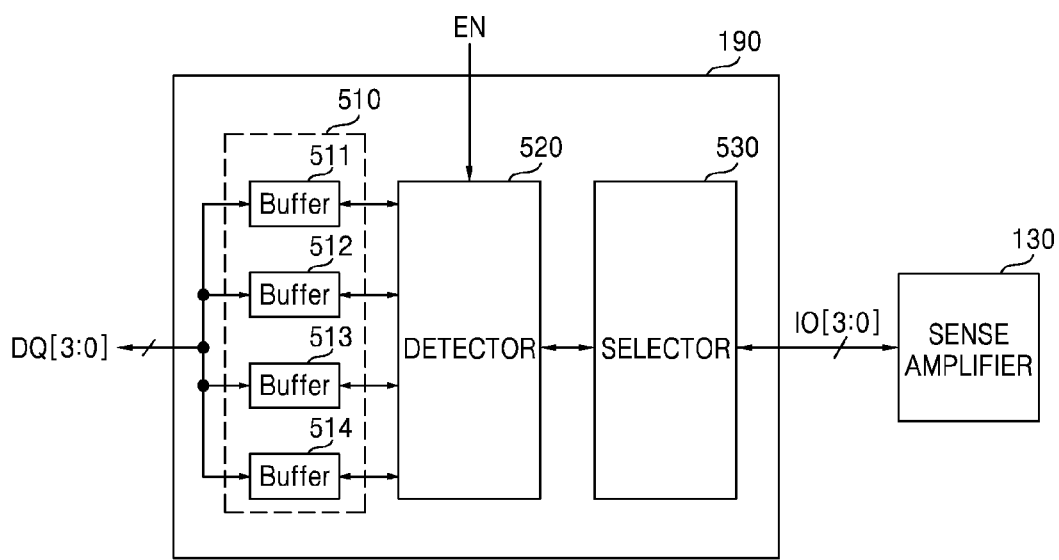
FIG. 6 is a diagram of a data input/output circuit illustrated in FIG. 5 according to some embodiments.
Figure 7:
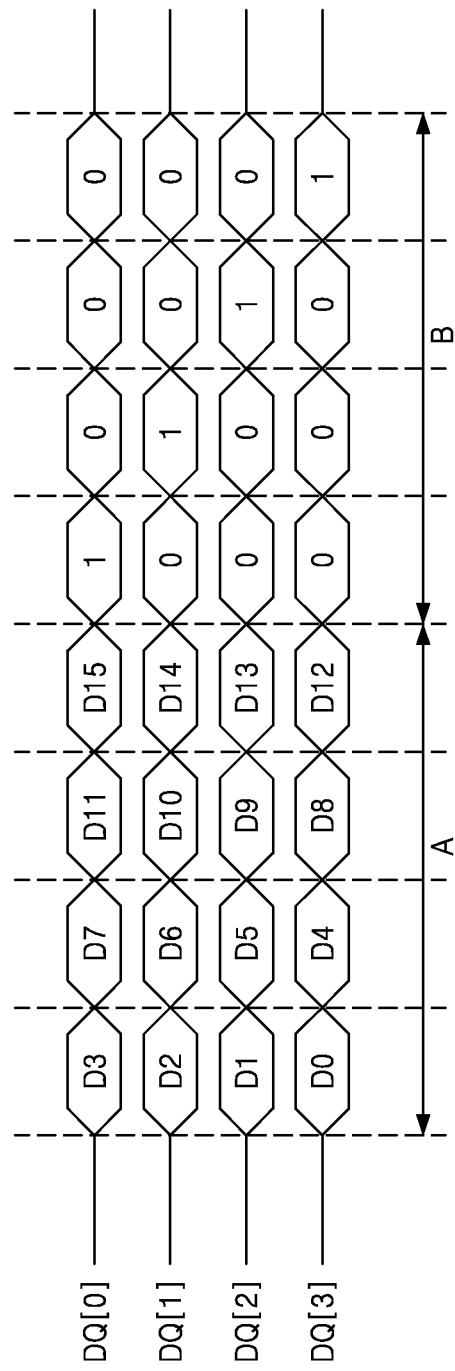
FIG. 7 is a diagram of an example of setting an input/output line using the data input/output circuit illustrated in FIG. 6 according to some embodiments.

FIG. 6 is a diagram of the data input/output circuit 190 according to some embodiments. FIG. 7 is a diagram of an example of setting an input/output line IO using the data input/output circuit 190 illustrated in FIG. 6 according to some embodiments. In the current embodiments, data with a burst length of 8 corresponding to each data pin DQ is input and output by the memory device 100 including four data pins DQ[3:0]. However, the disclosure is not restricted to the current embodiments.

Referring to FIGS. 4 through 7, the data input/output circuit 190 may include a buffer circuit 510, a detector 520, and a selector 530.

The data input/output circuit 190 may output the received data from the memory controller 200 to the memory cell array through a plurality of input/output lines electrically coupled to a plurality of bit lines, and may receive data read from the memory cell array through the plurality of input/output lines. Each of the received data may include a set of bits including actual data and data information. For example, the data information may include an input/output line code for selecting a corresponding input/output line. The input/output line code may have a code scheme. The code scheme may be shared across a group of input/output lines. For example, in one embodiment of an exemplary code scheme, a designated bit value is either 1 or 0, one bit of each input/output line code has the designated bit value, and a position of the designated bit value in the input/output line code determines an input/output line that corresponds to an external data pin that received the data.

The buffer circuit 510 may include first through fourth buffers 511, 512, 513, and 514 respectively corresponding to the four data pins DQ[3:0]. The first through fourth buffers 511 through 514 may respectively buffer write data input by the memory controller 200 through the respective data pins DQ[3:0] and output the buffered write data to the detector 520 and may also buffer read data received from the sense amplifier 130 and output the buffered read data to the memory controller 200.

The detector 520 may detect a designated value in each of the input/output line codes included in the received data from the memory controller 200 based on the enable signal EN received from the MRS/EMRS circuit 170 and may output a detection result.

The selector 530 may output the received data to the sense amplifier 130 through corresponding input/output lines IO[3:0] based on the detection result.

In one embodiment, the detector 520 and the selector 530 may perform the above-described operations in only an initial write operation of the memory device 100, and once data lines are set according to a result of performing the operations, data may be input and output based on the setting of the data lines in subsequent write operations and read operations of the memory device 100.

For instance, as shown in FIG. 7, for each data pin, a data set (e.g., 8 bits) including a first part A (e.g., 4 bits of actual data) and a second part B (e.g., 4 bits of an input/output line code) may be input by the memory controller 200. In one embodiment, in FIG. 7, the first part A and the second part B both may correspond to the input/output line code.

When a data set from the memory controller 200 is input to the data input/output circuit 190 through the data pins DQ[3:0], the first through fourth buffers 511 through 514 may respectively buffer data received through the respective data pins DQ[3:0] and may output buffered data to the detector 520.

In one embodiment, the detector 520 may detect the order in which bits having a value of "1" included in the input/output line code are input and output a detection result to the selector 530. For example, the detector 520 may output to the selector 530 the order in which bits of "1" are respectively input through the data pins DQ[3:0].

Based on the detection result, the selector 530 may output data D0, D4, D8, and D12 corresponding to the fourth data pin DQ[3]; data D1, D5, D9, and D13 corresponding to the third data pin DQ[2]; data D2, D6, D10, and D14 corresponding to the second data pin DQ[1]; and data D3, D7, D11, and D15 corresponding to the first data pin DQ[0] to the first through fourth input/output lines IO[0] through IO[3], respectively.

Thereafter, when read data is received from the sense amplifier 130, data respectively input through the first through fourth input/output lines IO[0] through IO[3] may be output to the fourth data pin DQ[3], the third data pin DQ[2], the second data pin DQ[1], and the first data pin DQ[0] through the fourth buffer 514, the third buffer 513, the second buffer 512, and the first buffer 511, respectively, based on the data lines set by the detector 520 and the selector 530.

Accordingly, data received from the memory controller 200 may be output to the input/output lines IO[3:0] according to the order in which bits having a designated value (e.g., "1") are input by the memory controller 200.

Figure 8:
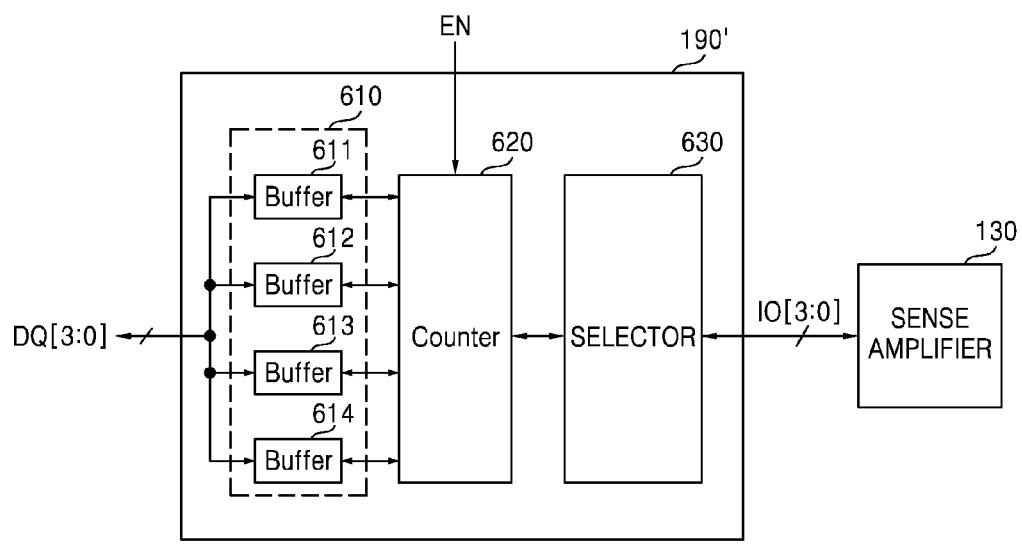
FIG. 8 is a diagram of a data input/output circuit illustrated in FIG. 5 according to other embodiments.
Figure 9:
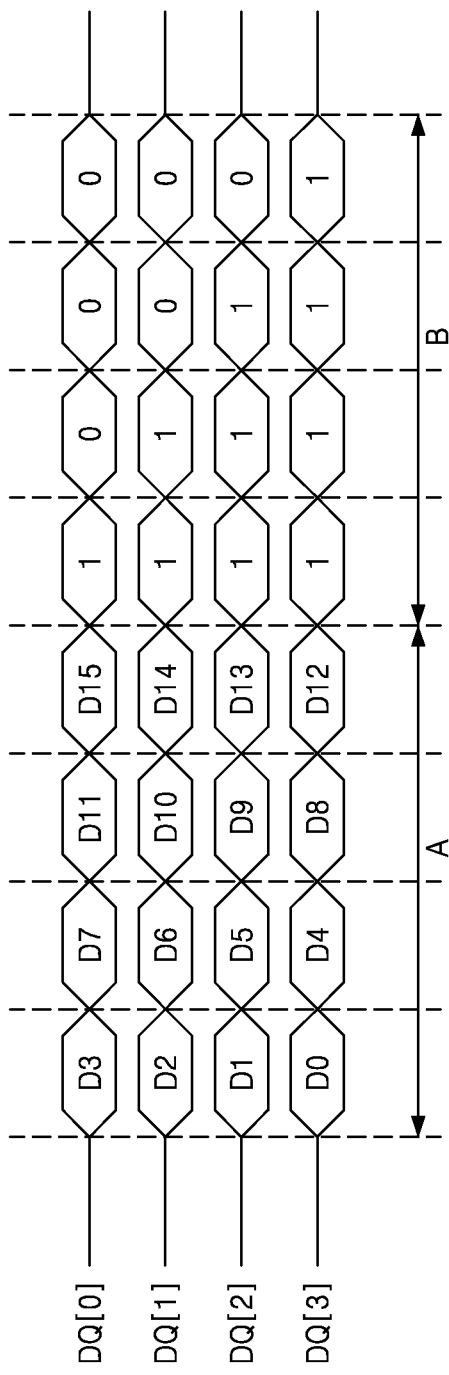
FIG. 9 is a diagram of an example of setting an input/output line using the data input/output circuit illustrated in FIG. 8 according to some embodiments.

FIG. 8 is a diagram of a data input/output circuit 190' according to other embodiments. FIG. 9 is a diagram of an example of setting an input/output line IO using the data input/output circuit 190' illustrated in FIG. 8 according to some embodiments. Referring to FIGS. 4, 5, 8, and 9, the data input/output circuit 190' may include a buffer circuit 610, a counter 620, and a selector 630.

The buffer circuit 610 may include first through fourth buffers 611, 612, 613, and 614 respectively corresponding to the four data pins DQ[3:0]. The first through fourth buffers 611 through 614 may respectively buffer write data input by the memory controller 200 through the respective data pins DQ[3:0] and output the buffered write data to the counter 620 and may also buffer read data received from the sense amplifier 130 and output the buffered read data to the memory controller 200.

The counter 620 may count the number of bits having a designated value (e.g., "1") included in the input/output line code received from the memory controller 200 input based on the enable signal EN received from the MRS/EMRS circuit 170 and may output a count result.

The selector 630 may output the received data to the sense amplifier 130 through corresponding input/output lines IO[3:0] based on the count result.

At this time, the counter 620 and the selector 630 may perform the above-described operations in only an initial write operation of the memory device 100, and once data lines are set according to a result of performing the operations, data may be input and output based on the setting of the data lines in subsequent write operations and read operations of the memory device 100.

For instance, as shown in FIG. 9, for each data pin, a data set (e.g., 8 bits) including a first part A (e.g., 4 bits of actual data) and a second part B (e.g., 4 bits of an input/output line code) may be input by the memory controller 200. Like the embodiments illustrated in FIG. 7, the first part A and the second part B both may correspond to the input/output line code.

When a data set is received as shown in FIG. 9, the first through fourth buffers 611 through 614 may respectively buffer data received through the respective data pins DQ[3:0] and may output buffered data to the counter 620.

The counter 620 may count the number of bits having a value of "1" included in the input/output line code and output a count result. For example, the counter 620 may output to the selector 630 the result of counting the number of bits of "1" are respectively input through the data pins DQ[3:0].

Based on the count result, the selector 630 may output data D0, D4, D8, and D12 corresponding to the fourth data pin DQ[3]; data D1, D5, D9, and D13 corresponding to the third data pin DQ[2]; data D2, D6, D10, and D14 corresponding to the second data pin DQ[1]; and data D3, D7, D11, and D15 corresponding to the first data pin DQ[0] to the first through fourth input/output lines IO[0] through IO[3], respectively.

Thereafter, when read data is received from the sense amplifier 130, data respectively input through the first through fourth input/output lines IO[0] through IO[3] may be output to the fourth data pin DQ[3], the third data pin DQ[2], the second data pin DQ[1], and the first data pin DQ[0] through the fourth buffer 614, the third buffer 613, the second buffer 612, and the first buffer 611, respectively, based on the data lines set by the counter 620 and the selector 630.

Accordingly, data received from the memory controller 200 may be output to the input/output lines IO[3:0] according to the number of bits having a designated value (e.g., "1").

Although data respectively corresponding to the fourth through first data pins DQ[3] through DQ[0] are output to the sense amplifier 130 through the first through fourth input/output lines IO[0] through IO[3], respectively, in the embodiments illustrated in FIGS. 7 and 9, the order of data input by the memory controller 200 is not restricted to these embodiments.

Figure 10:
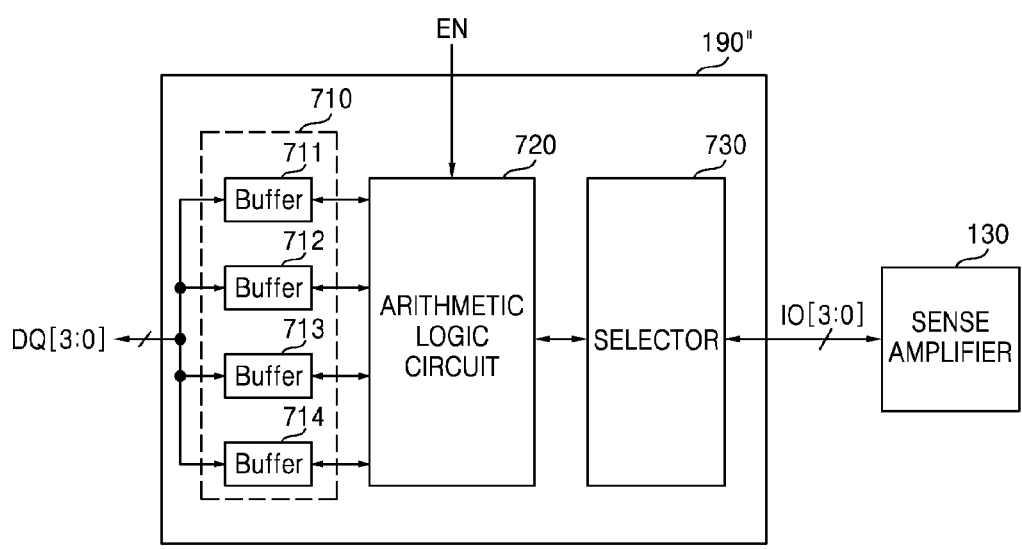
FIG. 10 is a diagram of a data input/output circuit illustrated in FIG. 5 according to further embodiments.
Figure 11A:
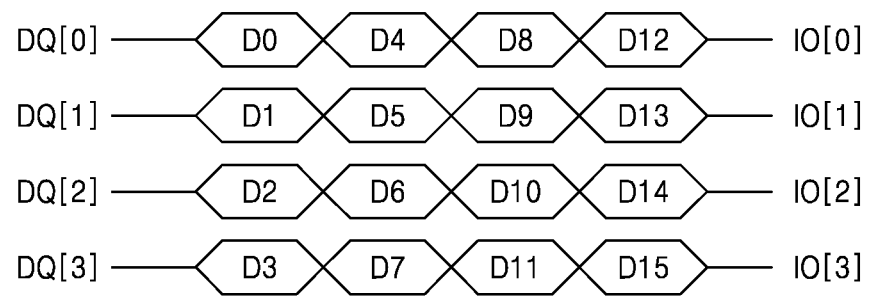

FIG. 10 is a diagram of a data input/output circuit 190" according to further embodiments. FIGS. 11A and 11B are diagrams of an example of setting an input/output line IO using the data input/output circuit 190" illustrated in FIG. 10 according to some embodiments. Referring to FIGS. 4, 5, 10, 11A, and 11B, the data input/output circuit 190" may include a buffer circuit 710, an arithmetic logic circuit 720, and a selector 730.

The buffer circuit 710 may include first through fourth buffers 711, 712, 713, and 714 respectively corresponding to the four data pins DQ[3:0]. The first through fourth buffers 711 through 714 may respectively buffer write data input by the memory controller 200 through the respective data pins DQ[3:0] and output the buffered write data to the arithmetic logic circuit 720 and may also buffer read data received from the sense amplifier 130 and output the buffered read data to the memory controller 200.

The arithmetic logic circuit 720 may perform a logic operation on each of first through fourth data sets Set1 through Set4 received from the memory controller 200 based on the enable signal EN received from the MRS/EMRS circuit 170 and may output a result of the logic operation. In one embodiment, the arithmetic logic circuit 720 may be implemented by an OR gate, but the disclosure is not restricted thereto. The arithmetic logic circuit 720 may be implemented by an AND gate, a NOR gate, or a NAND gate.

The selector 730 may output data computed based on the result of the logic operation performed by the arithmetic logic circuit 720 to the sense amplifier 130 through corresponding input/output lines IO[3:0].

In one embodiment, the arithmetic logic circuit 720 and the selector 730 may perform the above-described operations in only an initial write operation of the memory device 100, and once data lines are set according to a result of performing the operations, data may be input and output based on the setting of the data lines in subsequent write operations and read operations of the memory device 100.

In one embodiment, the memory controller 200 may input 16-bits data (D0 through D15) to the data input/output circuit 190" through the four data pins DQ[3:0], as shown in FIG. 11A.

In one embodiment, the memory controller 200 may input 64 bit data (d0 through d63), i.e., the first through fourth subsets of data Set1 through Set4 may input to the data input/output circuit 190" through the four data pins DQ[3:0], as shown in FIG. 11B. For example, each of the data pins DQ[3:0] may receive corresponding first through fourth subsets of data Set1 through Set4, and the received data from each data pin may be 16 bit data (e.g., 2ⁿ bits, n is a natural number grater than 0).

When the first through fourth subsets of data Set1 through Set4 are received from the memory controller 200, the first through fourth buffers 711 through 714 may respectively buffer subsets of data received through the respective data pins DQ[3:0] and may output buffered subsets of data to the arithmetic logic circuit 720.

The arithmetic logic circuit 720 may perform a logic operation by 4 bits on each of the first through fourth subsets of data Set1 through Set4 and output a result of the logic operation to the selector 730.

For instance, the arithmetic logic circuit 720 may perform a logic operation on each of 4-bit values, i.e., a value of d0 through d3, a value of d4 through d7, a value of d8 through d11, and a value of d12 through d15 included in the first subset of data Set1. The selector 730 may output a result of performing the logic operation on the 4-bit values (i.e., d0~d3, d4~d7, d8~d11, and d12~d15) to a first input/output line IO[0] as a subset of data of D0, D4, D8, and D12 corresponding to a first data pin DQ[0], as shown in FIG. 11A.

In one embodiment, when the logic operation is performed on bit values included in the first subset of data Set1, the subset of data of D0, D4, D8, and D12 corresponding to the first data pin DQ[0] may be computed and when the logic operation is performed on bit values included in the second subset of data Set2, the subset of data of D1, D5, D9, and D13 corresponding to the second data pin DQ[1] may be computed, as shown in FIG. 11A.

Consequently, the selector 730 outputs subsets of data, which are computed based on the result of the logic operation performed by the arithmetic logic circuit 720, to the first through fourth input/output lines IO[0] through IO[3], respectively.

Accordingly, first data input by the memory controller 200 may be output to the first through fourth input/output lines IO[0] through IO[3] as second data computed by the arithmetic logic circuit 720 performing the logic operation on the first data.

As described above, according to some embodiments, memory devices included in a memory module receive data the same way as particular data input by a test device even when the memory devices have different forms of data lines, thereby reducing test time.

While the disclosure has been particularly shown and described with reference to exemplary embodiments thereof, it will be understood by those of ordinary skill in the art that various changes in forms and details may be made therein without departing from the spirit and scope of the disclosure as defined by the following claims.

What is claimed is:

1. A memory device comprising:
    a memory cell array including a plurality of memory cells connected to a plurality of bit lines and a plurality of word lines; and
    a data input/output circuit configured to receive data having a burst length of n from m external data pins of the memory device, output the received data to the memory cell array through m input/output lines electrically coupled to the plurality of bit lines, receive data read from the memory cell array through the m input/output lines, and output the read data through the external data pins, m and n being greater than 2,
    wherein for each external data pin, the data input/output circuit is configured to output data received from the external data pin to a corresponding input/output line, wherein the corresponding input/output line is selected in response to bit values of a set of bits included in the received data, the set of bits comprising an input/output line code, such that m input/output line codes correspond to the m external data pins and m input/output lines,
    wherein each of the m input/output line codes comprises a code scheme in which a designed hit value is either 1 or 0, one bit of the input/output line code has the designated bit value, and a position of the designated bit value in the input/output line code determines an input/output line that corresponds to the external data pin that received the input/output line code.

2. The memory device of claim wherein the data input/output circuit comprises:
    a detector configured to detect the designated bit value in each of the m input/output line codes; and
    a selector configured to output the received data from each of the each external data pins to the corresponding input/output line based on a result of the detection.

3. A memory module comprising:
a plurality of memory devices, each of the memory devices being the memory device of claim 1,
wherein the memory module is one of an unbuffered dual inline memory module (UDIMM), a registered DIMM (RDIMM), or a load reduced DIMM (LR-DIMM).

4. A memory system comprising:
the memory module of claim 3; and
a test device configured to connect to the memory module and perform a test operation on the memory devices.

5. A memory device comprising:
a memory cell array including a plurality of memory cells connected to a plurality of bit lines and a plurality of word lines; and
a data input/output circuit configured to receive data from external data pins of the memory device, output the received data to the memory cell array through a plurality of input/output lines electrically coupled to the plurality of bit lines, receive data read from the memory cell array through the plurality of input/output lines, and output the read data through the external data pins,
wherein for a first external data pin, the data input/output circuit is configured to output data received from the first external data pin to a selected input/output line, wherein the input/output line is selected based on a first input/output line code included in the data received from the first external data pin.

6. The memory device of claim 5, wherein for a second external data pin, the data input/output circuit is configured to output data received from the second external data pin to a selected input/output line, wherein the input/output line is selected based on a second input/output line code included in the data received from the second external data pin.

7. The memory device of claim 6, wherein the first and second input/output line codes include a code scheme in which a designated bit value is either 1 or 0, one bit of each of the first and second input/output line codes has the designated bit value, and a position of the designated bit value in each of the first and second input/output line codes determines an input/output line that corresponds to the respective external data pin that received the respective input/output line code.

8. The memory device of claim 7, wherein the data input/output circuit comprises:
a detector configured to detect the designated bit value in each of the first and second input/output line codes; and
a selector configured to output the received data from each of the first and second external data pins to the corresponding input/output line based on a result of the detection.

9. The memory device of claim 6, wherein the first and second input/output line codes include a code scheme in which a designated bit value is either 1 or 0, and the number of bits in each of the first and second input/output line codes that have the designated bit value determines an input/output line that corresponds to the respective external data pin that received the respective input/output line code.

10. The memory device of claim 9, wherein the data input/output circuit comprises:
a counter configured to count the number of the designated bit value, in each of the first and second input/output codes; and
a selector configured to output the data received at each of first and second external data pins to the corresponding input/output line based on a count result.

11. A memory module comprising:
a plurality of memory devices, each being the memory device of claim 5,
wherein the memory module is one of an unbuffered dual inline memory module (UDIMM), a registered DIMM (RDIMM), or a load reduced DIMM (LR-DIMM).

12. A memory device comprising:
a memory cell array including a plurality of memory cells connected to a plurality of bit lines and a plurality of word lines; and
a data input/output circuit configured to receive data having a burst length of n from m external data pins of the memory device, output the received data to the memory cell array through m input/output lines electrically coupled to the plurality of bit lines, receive data read from the memory cell array through the m input/output lines, and output the read data through the external data pins, m and n being greater than 2,
wherein for each external data pin, the data input/output circuit is configured to output data received from the external data pin to a corresponding input/output line, wherein the corresponding input/output line is selected in response to bit values of a set of bits included in the received data, the set of bits comprising an input/output line code, such that m input/output line codes correspond to the m external data pins and m input/output lines,
wherein each of the m input/output line codes comprises a code scheme in which a designated bit value is either 1 or 0, and the number of bits in the input/output line code that have the designated bit value determines an input/output line that corresponds to the external data pin that received the input/output line code, and
wherein the data input/output circuit comprises:
a counter configured to count the number of the designated bit value, in each input/output line code; and
a selector configured to output the received data of the each external data pins to the corresponding input/output line based on a count result.

13. A memory module comprising:
a plurality of memory devices, each of the memory devices being the memory device of claim 12,
wherein the memory module is one of an unbuffered dual inline memory module (UDIMM), a registered DIMM (RDIMM), or a load reduced DIMM (LR-DIMM).

14. A memory system comprising:
the memory module of claim 13; and
a test device configured to connect to the memory module and perform a test operation on the memory devices.

* * * * *